United States Patent
Wang et al.

(10) Patent No.: US 9,910,335 B1
(45) Date of Patent: Mar. 6, 2018

(54) DISPLAY PANEL, METHOD OF MANUFACTURING DISPLAY PANEL, AND DISPLAY APPARATUS

(71) Applicant: BOE TECHNOLOGY GROUP CO., LTD., Beijing (CN)

(72) Inventors: Long Wang, Beijing (CN); Yanzhao Li, Beijing (CN); Changcheng Ju, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/647,563

(22) Filed: Jul. 12, 2017

(30) Foreign Application Priority Data

Aug. 29, 2016 (CN) .......................... 2016 1 0756905

(51) Int. Cl.
| | | |
|---|---|---|
| *G02F 1/1333* | (2006.01) | |
| *G02F 1/139* | (2006.01) | |
| *H01L 51/00* | (2006.01) | |
| *G02F 1/1334* | (2006.01) | |
| *G02F 1/137* | (2006.01) | |

(52) U.S. Cl.
CPC ............ *G02F 1/139* (2013.01); *G02F 1/1333* (2013.01); *H01L 51/0034* (2013.01);
(Continued)

(58) Field of Classification Search
CPC .......... G03F 7/20; G03F 7/2002; G02F 1/139; G02F 2001/13347; G02F 2001/13345;
(Continued)

(56) References Cited

U.S. PATENT DOCUMENTS 5,469,278 A * 11/1995 Takahara .............. G02F 1/1334
 348/E5.047
6,157,425 A * 12/2000 Kuo ....................... G02F 1/1393
 349/88
(Continued)

FOREIGN PATENT DOCUMENTS

CN 1096591 A 12/1994
CN 101183189 A 5/2008
(Continued)

OTHER PUBLICATIONS

Chinese Search Report, for Chinese Patent Application No. 201610756905.0, dated Feb. 16, 2017, 7 pages.
(Continued)

*Primary Examiner* — John A McPherson
(74) *Attorney, Agent, or Firm* — Kinney & Lange, P.A.

(57) ABSTRACT

Embodiments of the present disclosure disclose a display panel, a method of manufacturing the display panel, and a display apparatus. The display panel includes: a first substrate and a second substrate opposite to each other; a liquid crystal layer between the first substrate and the second substrate; and a plurality of pixel electrodes on a side of the first substrate facing towards the liquid crystal layer. Liquid crystal molecules of the liquid crystal layer in a region corresponding to each of the plurality pixel electrodes are in a polymer network state, and the more a distance between the each of the plurality of pixel electrodes and a light source of an edge-lighting type light source module of the display panel is, the more an area occupied by a polymer network in the region corresponding to the each of the plurality of pixel electrodes is.

20 Claims, 5 Drawing Sheets

(52) U.S. Cl.
CPC .............. *G02F 1/13336* (2013.01); *G02F 2001/13345* (2013.01); *G02F 2001/13347* (2013.01); *G02F 2001/13775* (2013.01)

(58) Field of Classification Search
CPC ......... G02F 2001/13775; G02F 1/1333; G02F 1/1343
USPC .............................. 430/20, 321; 349/88, 93
See application file for complete search history.

(56) References Cited

U.S. PATENT DOCUMENTS 6,331,881 B1 * 12/2001 Hatano ............. G02F 1/133377
349/156

2012/0132348 A1 * 5/2012 Kubota ................. G02F 1/1341
156/145

FOREIGN PATENT DOCUMENTS

| | | |
|---|---|---|
| CN | 102679238 A | 9/2012 |
| CN | 203941361 U | 11/2014 |
| CN | 105334677 A | 2/2016 |
| JP | H05203931 A | 8/1993 |

OTHER PUBLICATIONS

First Chinese Office Action, for Chinese Patent Application No. 201610756905.0, dated May 15, 2017, 7 pages.

* cited by examiner

DISPLAY PANEL, METHOD OF MANUFACTURING DISPLAY PANEL, AND DISPLAY APPARATUS

CROSS-REFERENCE TO RELATED APPLICATION

This application claims the benefit of Chinese Patent Application No. 201610756905.0 filed on Aug. 29, 2016, the whole disclosure of which is incorporated herein by reference.

BACKGROUND

1. Technical Field

Embodiments of the present invention relate to a display panel, a method of manufacturing the display panel, and a display apparatus.

2. Description of the Related Art

In a polymer-stabilized liquid crystal display, a light source module is of an edge-lighting type. When no voltage is applied, the polymer-stabilized liquid crystal display assumes a transparent state with a light transmittance of up to 90% or more. When a voltage is applied, liquid crystal molecules are deflected under the influence of the polymer so that their orientations are disordered, thereby scattering out light for displaying. The polymer-stabilized liquid crystal display has a very short response time, which can be up to about 1ms.

However, in a conventional polymer-stabilized liquid crystal display, the light source module is of the edge-lighting type. Therefore, as a distance between a pixel and a light source of the light source module is increased, a quantity of light introduced into a region where the pixel is located is gradually decreased, and the quality of light introduced into the region where the pixel is located will also be gradually decreased due to a display principle of emitting light by scattering the light, thereby resulting in a bad uniformity of a display luminance of the display.

Therefore, there is an urgent need in the art to improve the uniformity of the display luminance of the polymer-stabilized liquid crystal display.

SUMMARY

Accordingly, embodiments of the present disclosure provide a display panel comprising: a first substrate and a second substrate opposite to each other; a liquid crystal layer between the first substrate and the second substrate; and a plurality of pixel electrodes on a side of the first substrate facing towards the liquid crystal layer, liquid crystal molecules of the liquid crystal layer in a region corresponding to each of the plurality pixel electrodes are in a polymer network state, and the more a distance between the each of the plurality of pixel electrodes and a light source of an edge-lighting type light source module of the display panel is, the more an area occupied by a polymer network in the region corresponding to the each of the plurality of pixel electrodes is.

According to embodiments of the present disclosure, in the display panel according to the embodiments of the present disclosure, a ratio of a minimum to a maximum of the area occupied by the polymer network is less than 1 and is greater than or equal to ⅕.

According to embodiments of the present disclosure, the display panel according to the embodiments of the present disclosure further comprises: a transparent liquid absorbing layer which is located in the other area or the remaining area of a region where the liquid crystal layer is located than the areas where the polymer networks are located.

According to embodiments of the present disclosure, in the display panel according to the embodiments of the present disclosure, the light absorbing layer comprises: a first light absorbing layer on the other side of the first substrate facing away from the liquid crystal layer; and a second light absorbing layer on a side of the second substrate facing away from the liquid crystal layer.

According to embodiments of the present disclosure, the display panel according to the embodiments of the present disclosure further comprises: a first orientation layer on a side of the pixel electrodes facing towards the liquid crystal layer; and a second orientation layer on the other side of the second substrate facing towards the liquid crystal layer, the light absorbing layer comprises: a third light absorbing layer between the first orientation layer and the first substrate; and a fourth light absorbing layer between the second orientation layer and the second substrate.

According to embodiments of the present disclosure, the display panel according to the embodiments of the present disclosure further comprises: a common electrode between the second substrate and the second orientation layer, the third light absorbing layer is located between the first orientation layer and a film layer where the pixel electrodes are located, or is located between the film layer where the pixel electrodes are located and the first substrate, and the fourth light absorbing layer is located between the second orientation layer and the common electrode, or is located between the common electrode and the second substrate.

According to embodiments of the present disclosure, in the display panel according to the embodiments of the present disclosure, a material of the light absorbing layer comprises a polymethyl methacrylate material in which a light absorbing material is mixed; or a polyimide material in which a light absorbing material is mixed.

According to embodiments of the present disclosure, in the display panel according to the embodiments of the present disclosure, the light absorbing material comprises any one of salicylate, benzophenone, benzotriazole, substituted acrylonitrile, triazine, and hindered amine.

According to embodiments of the present disclosure, in the display panel according to the embodiments of the present disclosure, the liquid crystal molecules of the liquid crystal layer comprise photopolymerisable liquid crystal molecules.

According to embodiments of the present disclosure, in the display panel according to the embodiments of the present disclosure, the photopolymerisable liquid crystal molecules are liquid crystal molecules containing vinyl.

According to embodiments of the present disclosure, the display panel according to the embodiments of the present disclosure further comprises: a polymerization initiator in the liquid crystal layer.

Embodiments of the present disclosure also provide a display apparatus comprises: the display panel according to the embodiments of the present disclosure.

Embodiments of the present disclosure further provide a method of manufacturing a display panel. The method comprises: forming a liquid crystal case, wherein the liquid crystal case comprises: a first substrate and a second substrate opposite to each other; a liquid crystal layer between the first substrate and the second substrate; and a plurality of pixel electrodes on a side of the first substrate facing towards the liquid crystal layer; and irradiating the liquid crystal case to photopolymerize liquid crystal molecules of the liquid crystal layer in a region corresponding to each of the plurality pixel electrodes, thereby forming a polymer network, such that liquid crystal molecules in photopolymerization meet the followings: the more a distance between the each of the plurality of pixel electrodes and a light source of an edge-lighting type light source module of the display panel is, the more an area occupied by the polymer network formed by photopolymerizing the liquid crystal molecules in the region corresponding to the each of the plurality of pixel electrodes is.

According to embodiments of the present disclosure, in the method according to the embodiments of the present disclosure, the irradiating the liquid crystal case specifically comprises: irradiating the liquid crystal case with ultraviolet ray through a mask, wherein the mask comprises a plurality of opening regions in one-to-one correspondence with the plurality of pixel electrodes, and the more the distance between the each of the plurality of pixel electrodes and the light source of the edge-lighting type light source module of the display panel is, the more an area occupied by the opening region corresponding to the each of the plurality of pixel electrodes is.

According to embodiments of the present disclosure, the method according to the embodiments of the present disclosure further comprises: while the liquid crystal case is formed, forming a transparent light absorbing layer in the other area or the remaining area of a region where the liquid crystal layer is located than the areas where the polymer networks to be formed are located; and the irradiating the liquid crystal case specifically comprises: irradiating the liquid crystal case with ultraviolet ray.

According to embodiments of the present disclosure, in the method according to the embodiments of the present disclosure, the irradiating the liquid crystal case with the ultraviolet ray comprises: irradiating the liquid crystal case with the ultraviolet ray with the light absorbing layer as a mask.

According to embodiments of the present disclosure, in the method according to the embodiments of the present disclosure, a material of the light absorbing layer comprises a polymethyl methacrylate material in which a light absorbing material is mixed; or a polyimide material in which a light absorbing material is mixed.

According to embodiments of the present disclosure, in the method according to the embodiments of the present disclosure, the light absorbing material comprises any one of salicylate, benzophenone, benzotriazole, substituted acrylonitrile, triazine, and hindered amine.

According to embodiments of the present disclosure, in the method according to the embodiments of the present disclosure, the liquid crystal molecules in the liquid crystal layer comprise liquid crystal molecules containing vinyl.

According to embodiments of the present disclosure, in the method according to the embodiments of the present disclosure, the display panel further comprises a polymerization initiator in the liquid crystal layer.

DETAILED DESCRIPTION OF THE EMBODIMENTS

Figure 1:
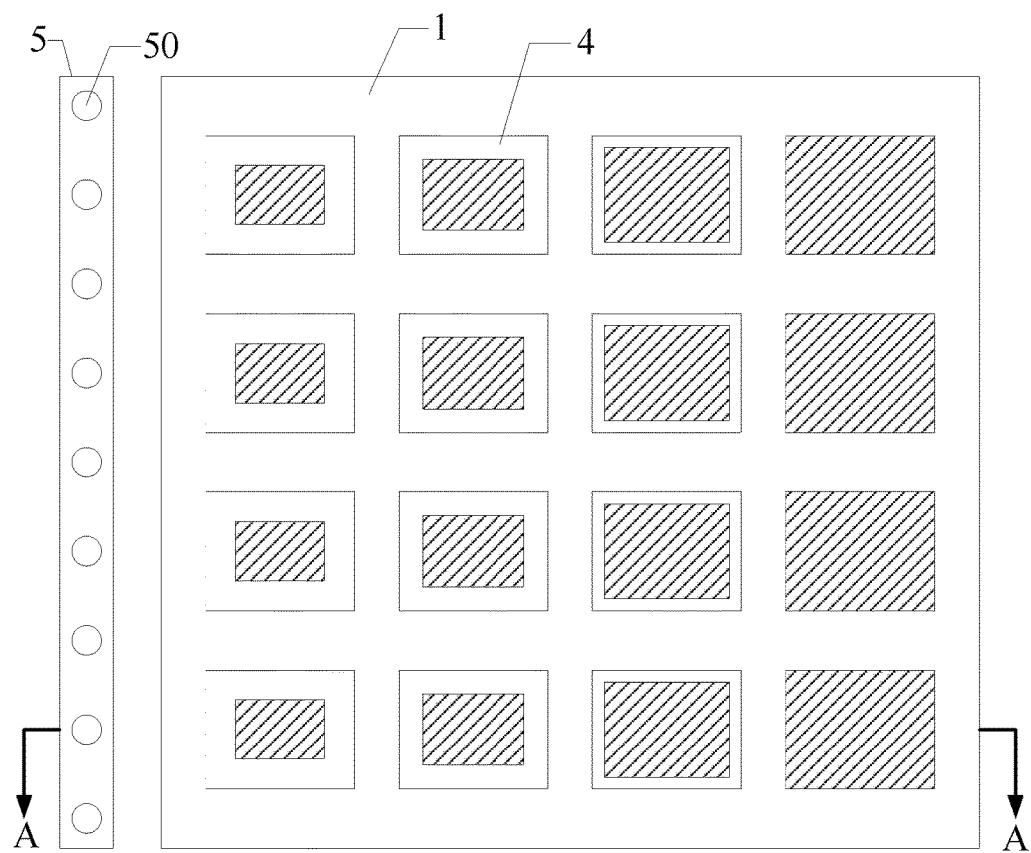
FIG. 1 is a schematic diagram showing a structure of a display panel according to an embodiment of the present disclosure.

A further description of the invention will be made in detail as below with reference to embodiments of the present disclosure taken in conjunction with the accompanying drawings. The invention may, however, be embodied in many different forms and should not be construed as being limited to the embodiment set forth herein; rather, these embodiments are provided so that the present disclosure will be thorough and complete, and will fully convey the concept of the disclosure to those skilled in the art.

A further description of the invention will be made in detail as below with reference to embodiments of the present disclosure taken in conjunction with the accompanying drawings. In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A display panel, a method of manufacturing the display panel, and a display apparatus will be described in detail as below with reference to embodiments of the present invention taken in conjunction with the accompanying drawings.

In the drawings, shapes and thicknesses of film layers do not reflect a real scale, and the only purpose is to schematically show the embodiments of the present invention.

Figure 2:
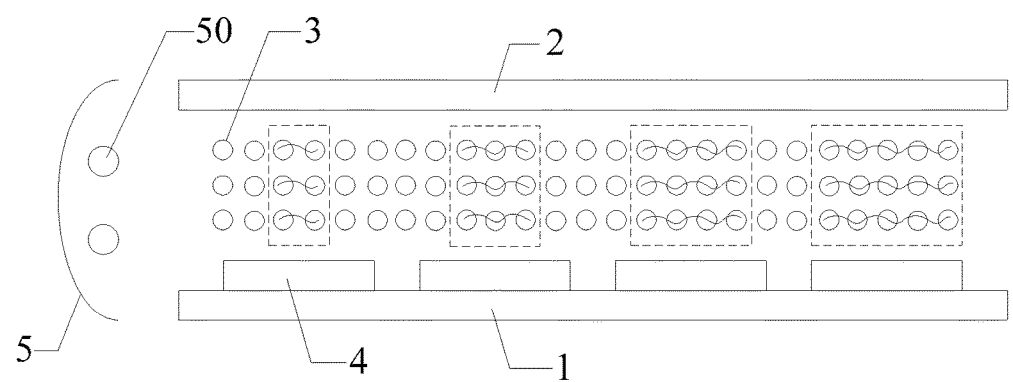
FIG. 2 is a sectional view taken along the line A-A in FIG. 1.

FIG. 1 is a schematic diagram showing a structure of a display panel according to an embodiment of the present invention, and FIG. 2 is a sectional view taken along the line A-A in FIG. 1. As shown in FIG. 1 and FIG. 2, a display panel according to embodiments of the present invention comprises: a first substrate 1 and a second substrate 2 (only the first substrate 1 is shown in FIG. 1) opposite to each other; a liquid crystal layer 3 between the first substrate 1 and the second substrate 2; and a plurality of pixel electrodes 4 (for example, 4 rows by 4 columns of pixel electrodes are taken as an example in FIG. 1) on a side of the first substrate 1 facing towards the liquid crystal layer 3.

Liquid crystal molecules of the liquid crystal layer 3 in a region corresponding to each of the plurality pixel electrodes 4 are in a polymer network state (as indicated by shaded regions in FIG. 1 and also as indicated by dashed boxes in FIG. 2), and the more a distance between the each of the plurality of pixel electrodes 4 and a light source 50 of an edge-lighting type light source module 5 of the display panel is, the more an area occupied by a polymer network in the region corresponding to the each of the plurality of pixel electrodes 4 is.

In the display panel according to the embodiments of the present invention, the liquid crystal molecules of the liquid crystal layer in the region corresponding to each of the plurality pixel electrodes are in the polymer network state, and the more the distance between the each of the plurality of pixel electrodes and the light source of the edge-lighting type light source module is, the more the area occupied by the polymer network in the region corresponding to the each of the plurality of pixel electrodes is. In this way, when a voltage is applied to any one of the plurality of pixel electrodes, the liquid crystal molecules in the region corresponding to the one of the plurality pixel electrodes are affected by the polymer network when being deflected, so that their orientations are disordered, thereby scattering out light. The more the distance between the one of the plurality of pixel electrodes and the light source is, the more a light emitting area, where light is scattered out, of the region corresponding to the one of the plurality of pixel electrodes is. In other words, the more a distance between a pixel and the light source is, the more an effective light emitting area of the pixel is and the more a quantity of light emitted from the pixel is, thereby compensating the problem that the more the distance between the pixel and the light source is, the less a quantity of light introduced from the light source into a region where the pixel is located is, occurring in the edge-lighting type light source module. In this way, a quantity of light emitted from each pixel is controlled by adjusting its effective light emitting area, so that uniformity of a display luminance of the display panel can be effectively improved.

In an example, in the display panel according to the embodiments of the present invention, the liquid crystal molecules of the liquid crystal layer may comprise photopolymerisable liquid crystal molecules and common liquid crystal molecules. The photopolymerisable liquid crystal molecules may be liquid crystal molecules containing vinyl, which can be polymerized when being irradiated by ultraviolet ray, thereby forming the polymer network. Generally, a proportion of the photopolymerisable liquid crystal molecules in the liquid crystal molecules of the liquid crystal layer may be controlled to be less than or equal to 10%. For example, the proportion of the photopolymerisable liquid crystal molecules in the liquid crystal molecules of the liquid crystal layer may be controlled to be in the range of 2% to 6%. For example, in order to assist the polymerization, a polymerization initiator may be added to liquid crystal molecule mixture. Furthermore, according to embodiments of the present invention, a difference between a dielectric constant of the liquid crystal molecule along a major axis and a dielectric constant of the liquid crystal molecule along a minor axis, and a difference between a refractive index of the liquid crystal molecule along the major axis and a refractive index of the liquid crystal molecule along the minor axis are relative big, and the liquid crystal has a relatively small coefficient of viscosity.

Figure 3A:
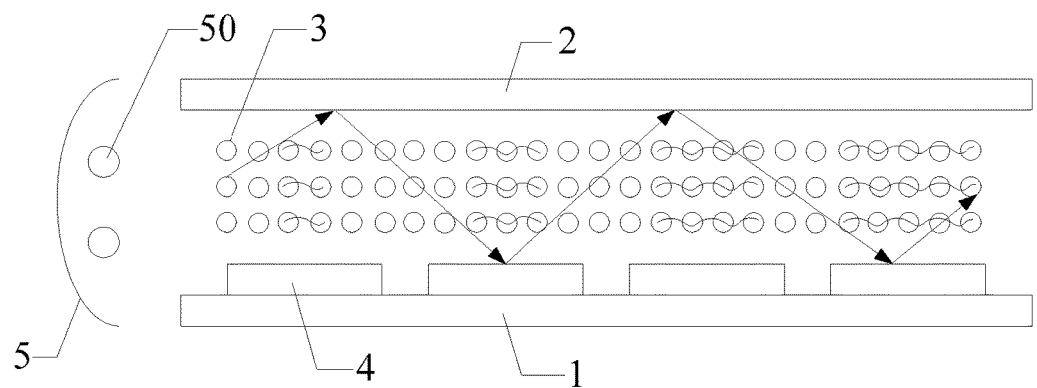
FIG. 3a is a schematic diagram showing an operational principle of the display panel according to the embodiment of the present disclosure in a transparent state.
Figure 3B:
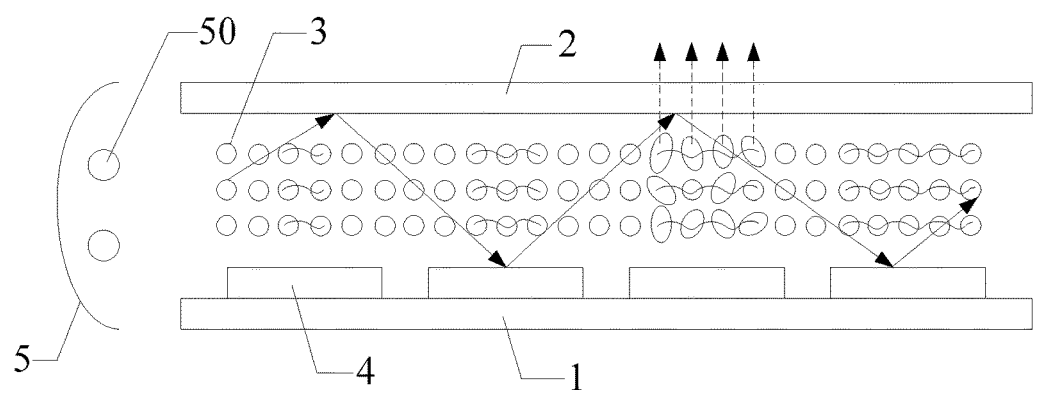
FIG. 3b is a schematic diagram showing an operational principle of the display panel according to the embodiment of the present disclosure in a displaying state.

An operational principle of the display panel according to the embodiment of the present invention is as follows. As shown in FIG. 3a, when no voltage is applied to the pixel electrode 4, the liquid crystal molecules of the liquid crystal layer 3 are not deflected and are arranged regularly. Light emitted from the light source 50 of the edge-lighting type light source module 5 is totally reflected in the display panel (as indicated by solid arrows in FIG. 3a). In this case, the display panel is in a transparent state. As shown in FIG. 3b, when a voltage is applied to the pixel electrode 4, the liquid crystal molecules of the liquid crystal layer 3 are deflected and their orientations are disordered due to an influence of the polymer network, so that light emitted from the light source 50 of the edge-lighting type light source module 5 is scattered out (as indicated by dashed arrows in FIG. 3b). In this case, the display panel displays a picture. The display panel according to the embodiments of the present invention can assume a transparent state without supplying an electric power to it, so that a power consumption can be reduced compared with a conventional transparent display panel which can assume a transparent state only if a voltage is applied to it.

In an example, in the display panel according to the embodiments of the present invention, as shown in FIG. 1, the pixel electrodes 4 have the same size. In other words, physical areas of the pixel electrodes 4 are equal to one another. An area occupied by the polymer network in the region corresponding to any one of the plurality of pixel electrodes 4, excepting a rightmost column of pixel electrodes 4, is less than the physical area of the region corresponding to the one of the plurality of pixel electrodes 4. In other words, an effective light emitting area of the region corresponding to any one of the plurality of pixel electrodes 4, excepting the rightmost column of pixel electrodes 4, is less than the physical area of the region corresponding to the one of the plurality of pixel electrodes 4. Of course, the effective light emitting area and the physical area of the region corresponding to each of the plurality of pixel electrodes may also be equal to each other. In other words, the more the distance between any one of the plurality of pixel electrodes and the light source of the edge-lighting type light source module is, the more the size and the physical area of the one of the plurality of pixel electrodes are and the more the area occupied by the polymer network in the region corresponding to the one of the plurality of pixel electrodes is.

In an example, in the display panel according to the embodiments of the present invention, the more a size of the display panel is, the less a ratio of the effective light emitting area (i.e. a minimum of the area occupied by the polymer network) of the region corresponding to one, which is closest to the edge-lighting type light source module, of the plurality of pixel electrodes to the effective light emitting area (i.e. a maximum of the area occupied by the polymer network) of the region corresponding to one, which is farthest from the edge-lighting type light source module, of the plurality of pixel electrodes is. In order to avoid an influence of a big difference between the effective light emitting areas of the regions corresponding to the different pixel electrodes on a visual effect of a picture displayed on the display panel and viewed by a viewer, for example, a ratio of the minimum to the maximum of the area occupied by the polymer network may be controlled to be in the range that is less than 1 and is greater than or equal to $\frac{1}{5}$.

It is to be noted that the display panel according to the embodiments of the present invention is relatively applicable to an environment of a long-wave band (for example, a near infrared band and a visible band). When the display panel according to the embodiments of the present invention is used in the environment of the long-wave band, the liquid crystal molecules of the liquid crystal layer excepting the liquid crystal molecules that have been formed into the polymer networks have a stable property and will not be polymerized into the polymer networks by being irradiated with ambient light of the long-wave band. As a result, normal displaying and the uniformity of the display luminance of the display panel will not be adversely affected. When the display panel according to the embodiments of the present invention is used in an environment of a short-wave band (for example, a near ultraviolet band), the liquid crystal molecules of the liquid crystal layer of the display panel excepting the liquid crystal molecules that have been formed into the polymer networks will be polymerized into the polymer networks by being irradiated with ambient light of the short-wave band. As a result, the uniformity of the display luminance of the display panel will be adversely affected directly and even the normal displaying of the display panel will be adversely affected.

Figure 4:
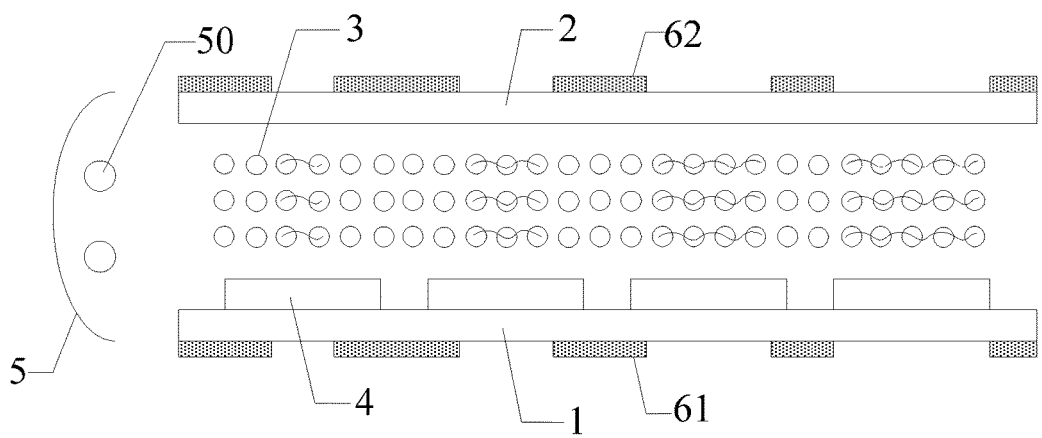
FIG. 4 is a schematic diagram showing a structure of a display panel according to another embodiment of the present disclosure.
Figure 5:
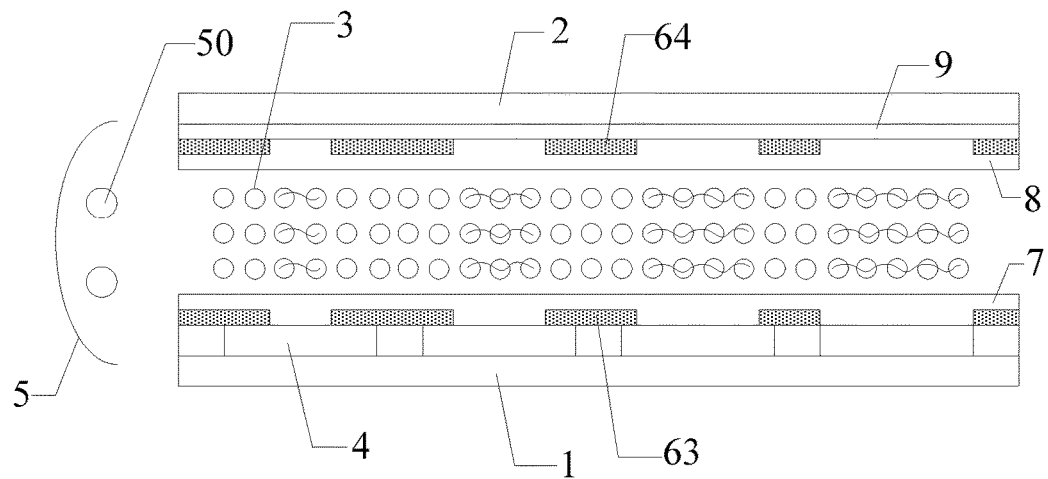
FIG. 5 is a schematic diagram showing a structure of a display panel according to a further embodiment of the present disclosure.
Figure 6:
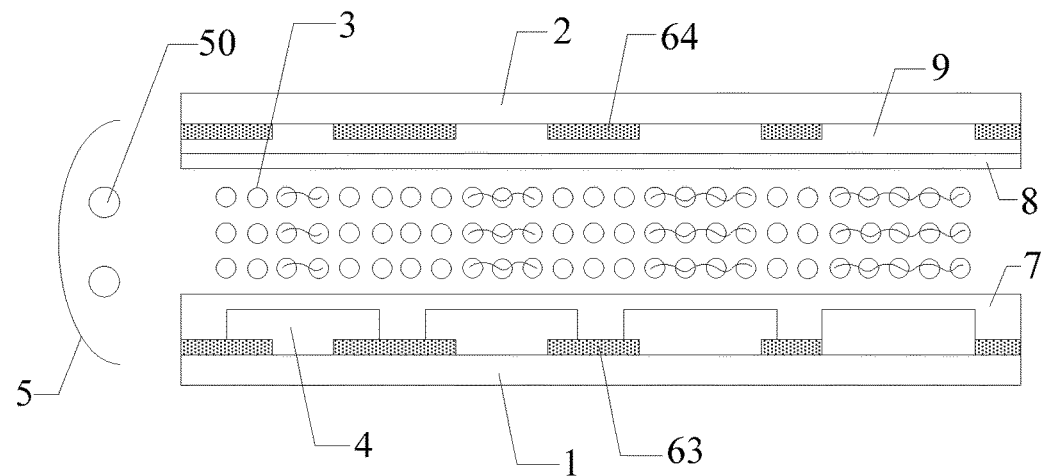
FIG. 6 is a schematic diagram showing a structure of a display panel according to a still another embodiment of the present disclosure.

Therefore, as shown in FIG. 4 to FIG. 6, the display panel according to the embodiments of the present invention may further comprise: a transparent liquid absorbing layer 6 which is located in the other area (the remaining area) of a region where the liquid crystal layer 3 is located than the areas where the polymer networks are located, for example when viewed in a direction perpendicular to the liquid crystal layer 3, In this way, when the display panel according to the embodiments of the present invention is used in the environment of the short-wave band, the liquid absorbing layer 6 can protect the liquid crystal molecules of the liquid crystal layer 3 excepting the liquid crystal molecules that have been formed into the polymer networks from being polymerized into the polymer networks under the irradiation of the ambient light of the short-wave band. As a result, the normal displaying and the uniformity of the display luminance of the display panel can be ensured so that usage of the display panel will not be limited by ambient environment and the display panel will be widely applied. Furthermore, additional provision of the liquid absorbing layer 6 will not adversely affect an aperture ratio of the display panel since the liquid absorbing layer 6 is transparent.

In an example, in the display panel according to the embodiments of the present invention, the liquid absorbing layer functions to protect the liquid crystal molecules of the liquid crystal layer excepting the liquid crystal molecules that have been formed into the polymer networks from being irradiated by the ambient light. Therefore, the liquid absorbing layer needs to be disposed in the other area or the remaining area of the region where the liquid crystal layer is located than the areas where the polymer networks are located. Specifically, the liquid absorbing layer may be disposed outside the display panel or inside the display panel.

The light absorbing layer of the display panel according to the embodiments of the present invention will be expounded by means of specific examples.

In an example, the liquid absorbing layer is disposed outside the display panel. In the display panel according to the embodiments of the present invention, as shown in FIG. 4, the liquid absorbing layer 6 may comprise: a first light absorbing layer 61 on the other side of the first substrate 1 facing away from the liquid crystal layer 3; and a second light absorbing layer 62 on a side of the second substrate 2 facing away from the liquid crystal layer 3.

In another example, the liquid absorbing layer is disposed inside the display panel. As shown in FIG. 5 and FIG. 6, the display panel according to the embodiments of the present invention may further comprise: a first orientation layer 7 on a side of the pixel electrodes 4 facing towards the liquid crystal layer 3; and a second orientation layer 8 on the other side of the second substrate 2 facing towards the liquid crystal layer 3. For example, the liquid absorbing layer 6 is disposed between the first orientation layer 7 and the first substrate 1 and between the second orientation layer 8 and the second substrate 2, rather than between the first orientation layer 7 and the liquid crystal layer 3 and between the second orientation layer 8 and the liquid crystal layer 3, in order to avoid an influence on normal orientations of the liquid crystal molecules. In other words, the liquid absorbing layer 6 may comprise: a third light absorbing layer 63 between the first orientation layer 7 and the first substrate 1; and a fourth light absorbing layer 64 between the second orientation layer 8 and the second substrate 2, as shown in FIG. 5 and FIG. 6.

In an example, the display panel according to the embodiments of the present invention may be applied to an advanced super dimension switch (ADS) type liquid crystal display panel and an in-plane switch (IPS) type liquid crystal display panel. In this case, a common electrode insulated from the pixel electrodes is also disposed on the side of the first substrate facing towards the liquid crystal layer. In addition, the display panel according to the embodiments of the present invention may also be applied to a twisted nematic (TN) type liquid crystal display panel. In this case, a common electrode is disposed on the other side of the second substrate facing towards the liquid crystal layer.

Specifically, the display panel according to the embodiments of the present invention being applied to the TN type liquid crystal display panel is taken as an example. As shown in FIG. 5 and FIG. 6, the display panel may further comprise: a common electrode 9 between the second substrate 2 and the second orientation layer 8. As shown in FIG. 5, the third light absorbing layer 63 is located between the first orientation layer 7 and the pixel electrodes 4 and the fourth light absorbing layer 64 is located between the second orientation layer 8 and the common electrode 9; or, as shown in FIG. 6, the third light absorbing layer 63 is located between the pixel electrodes 4 and the first substrate 1 and the fourth light absorbing layer 64 is located between the common electrode 9 and the second substrate 2.

Of course, in the display panel according to the embodiments of the present invention, the third light absorbing layer may also be disposed between the first orientation layer and the pixel electrodes and the fourth light absorbing layer may also be disposed between the common electrode and the second substrate; or the third light absorbing layer may also be disposed between the pixel electrodes and the first substrate and the fourth light absorbing layer may also be disposed between the second orientation layer and the common electrode.

In an example, in the display panel according to the embodiments of the present invention, a material of the light absorbing layer may be a polymethyl methacrylate material in which a light absorbing material is mixed; a polyimide material in which a light absorbing material is mixed; or other materials capable of absorbing light of short wavelength.

For example, the material of the light absorbing layer may be a material having a high refractive index. In this way, when the display panel is in a transparent state, it can be ensured that the light emitted from the light source of the edge-lighting type light source module is totally reflected between the first substrate and the second substrate, thereby improving a utilization ratio of the light of the light source and a light emitting efficiency of the display panel, and reducing a power consumption of the display panel.

In an example, in the display panel according to the embodiments of the present invention, the light absorbing material may be specifically any one of salicylate, benzophenone, benzotriazole, substituted acrylonitrile, triazine, and hindered amine.

Figure 7:
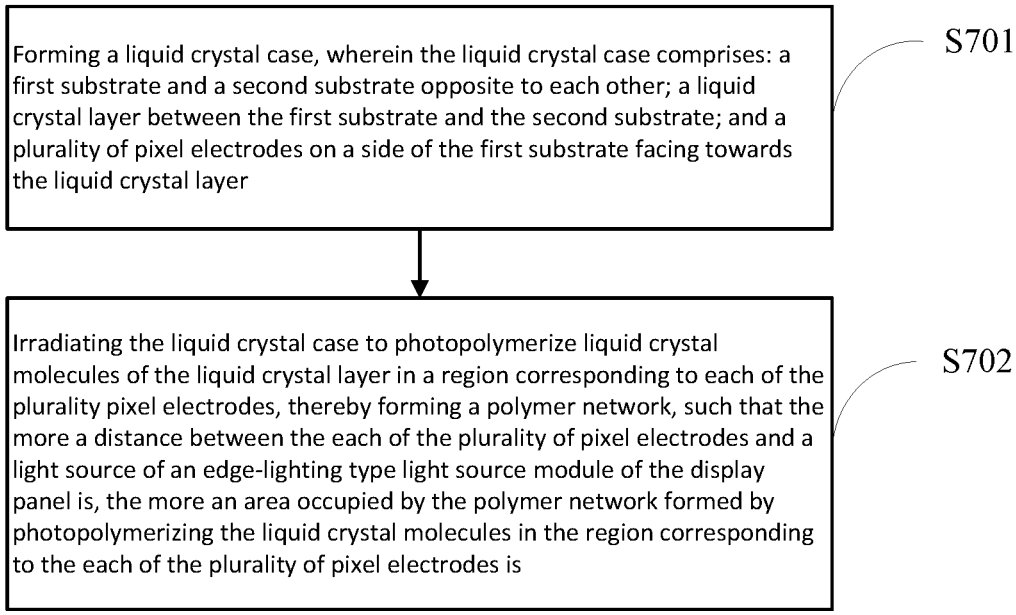
FIG. 7 is a flow diagram of a method of manufacturing a display panel according to an embodiment of the present disclosure.

Base on the same inventive concept, as shown in FIG. 7, embodiments of the present invention also provide a method of manufacturing a display panel. The method comprises the following steps.

In a step S701, a liquid crystal case is formed. The liquid crystal case comprises: a first substrate and a second substrate opposite to each other; a liquid crystal layer between the first substrate and the second substrate; and a plurality of pixel electrodes on a side of the first substrate facing towards the liquid crystal layer.

Specifically, a thickness of the liquid crystal case may be controlled in the range of 2 µm to 10 µm. For example, the thickness of the liquid crystal case is controlled in the range of 3 µm to 5 µm. A material of the pixel electrodes may be a material that has a higher refractive index than glass, such as indium tin oxide (ITO) and the like. A manufacturing process of the liquid crystal case is similar to that of a conventional liquid crystal case and is no longer described for the sake of brevity.

In a step S702, the liquid crystal case is irradiated to photopolymerize liquid crystal molecules of the liquid crystal layer in a region corresponding to each of the plurality pixel electrodes, thereby forming a polymer network, such that the more a distance between the each of the plurality of pixel electrodes and a light source of an edge-lighting type light source module of the display panel is, the more an area occupied by the polymer network formed by photopolymerizing the liquid crystal molecules in the region corresponding to the each of the plurality of pixel electrodes is.

In the method according to the embodiments of the present invention, when the liquid crystal case is irradiated to photopolymerize, into a polymer network form, the liquid crystal molecules of the liquid crystal layer in the region corresponding to each of the plurality pixel electrodes, the liquid crystal molecules are photopolymerized such that the more the distance between the each of the plurality of pixel electrodes and the light source of the edge-lighting type light source module is, the more the area occupied by the polymer network formed by photopolymerizing the liquid crystal molecules in the region corresponding to the each of the plurality of pixel electrodes is. In this way, when a voltage is applied to any one of the plurality of pixel electrodes, the liquid crystal molecules in the region corresponding to the one of the plurality pixel electrodes are affected by the polymer network when being deflected, so that their orientations are disordered, thereby scattering out light. The more the distance between the one of the plurality of pixel electrodes and the light source is, the more a light emitting area, where light is scattered out, of the region corresponding to the one of the plurality of pixel electrodes is. In other words, the more a distance between the region corresponding to one of the plurality of pixel electrodes and the light source is, the more an effective light emitting area of the region corresponding to the one of the plurality of pixel electrodes is and the more a quantity of light emitted from the region corresponding to the one of the plurality of pixel electrodes is, thereby compensating the problem that the more a distance between a pixel and the light source is, the less a quantity of light introduced from the light source into a region where the pixel is located is, occurring in the edge-lighting type light source module. In this way, a quantity of light emitted from each pixel is controlled by adjusting its effective light emitting area, so that uniformity of a display luminance of the display panel can be effectively improved.

Figure 8:
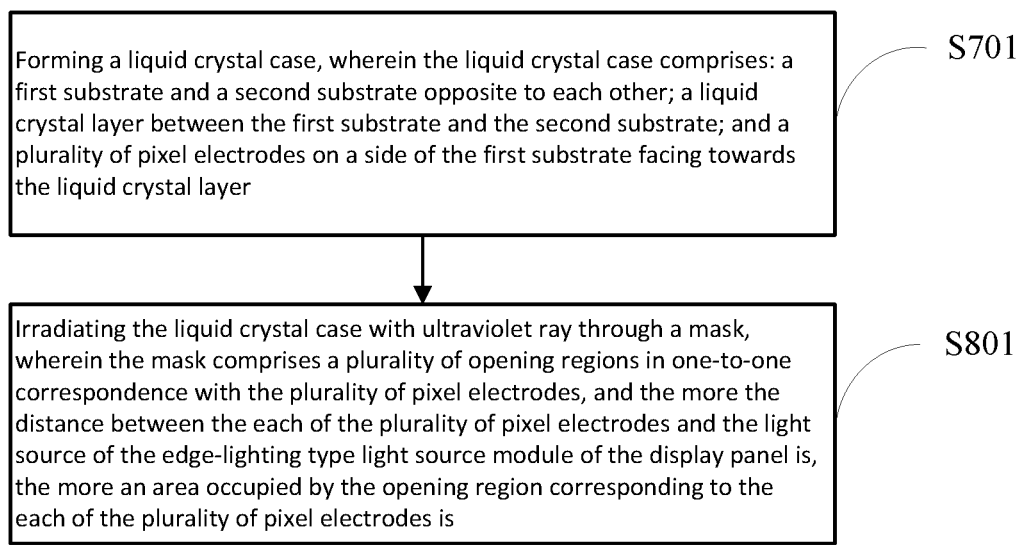
FIG. 8 is a flow diagram of a method of manufacturing a display panel according to another embodiment of the present disclosure.

In an example, when the step S702 of the method according to the embodiments of the present invention is performed to irradiate the liquid crystal case, the step S702 may specifically comprise the following step as shown in FIG. 8.

In a step S801, the liquid crystal case is irradiated with ultraviolet ray through a mask. The mask comprises a plurality of opening regions in one-to-one correspondence with the plurality of pixel electrodes, and the more the distance between the each of the plurality of pixel electrodes and the light source of the edge-lighting type light source module of the display panel is, the more an area occupied by the opening region corresponding to the each of the plurality of pixel electrodes is. In this way, the liquid crystal molecules can be photopolymerized such that the more the distance between any one of the plurality of pixel electrodes and the light source of the edge-lighting type light source module is, the more the area occupied by the polymer network formed by photopolymerizing the liquid crystal molecules by irradiating them with ultraviolet ray in the region corresponding to the one of the plurality of pixel electrodes is.

Figure 9A:
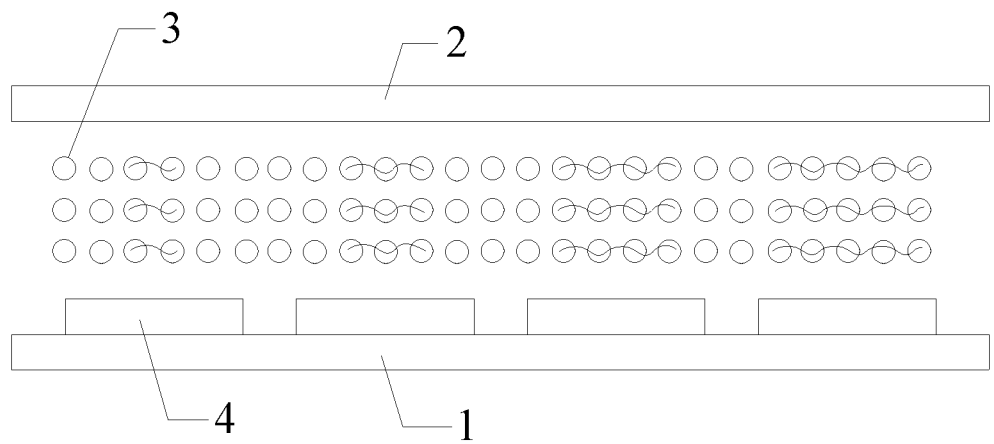
FIG. 9a and FIG. 9b are schematic diagrams showing structures of the display panel according to the embodiment of the present disclosure after steps of a method shown in FIG. 8 are performed, respectively.
Figure 9B:
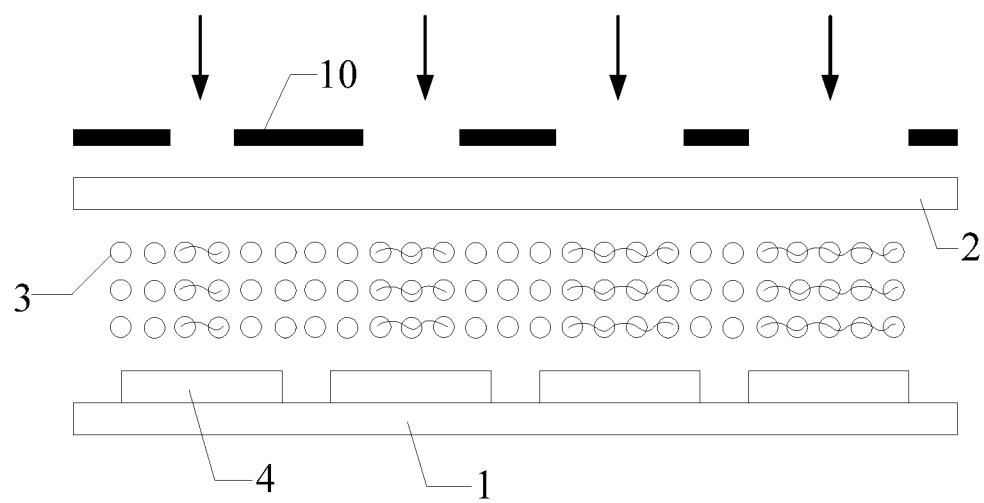

Specifically, in the method according to the embodiments of the present invention, firstly, as shown in FIG. 9a, a liquid crystal case is formed. The liquid crystal case comprises: a first substrate 1 and a second substrate 2 opposite to each other; a liquid crystal layer 3 between the first substrate 1 and the second substrate 2; and a plurality of pixel electrodes 4 on a side of the first substrate 1 facing towards the liquid crystal layer 3. Then, as shown in FIG. 9b, the liquid crystal case is irradiated with ultraviolet ray through a mask 10 (as indicated by arrows in FIG. 9b) such that liquid crystal molecules, which correspond to the opening regions of the mask 10 and which are not blocked by the mask 10, are photopolymerized, thereby forming polymer networks.

For example, while the step S701 of the method according to the embodiments of the present invention is performed to form the liquid crystal case, a transparent liquid absorbing layer may also be formed in the other area or the remaining area of a region where the liquid crystal layer is located than the areas where the polymer networks to be formed are located. In this way, when the display panel manufactured by the method according to the embodiments of the present invention is used in the environment of the short-wave band, the liquid absorbing layer can protect the liquid crystal molecules of the liquid crystal layer excepting the liquid crystal molecules that have been formed into the polymer networks from being polymerized into the polymer networks under the irradiation of the ambient light of the short-wave band. As a result, the normal displaying and the uniformity of the display luminance of the display panel can be ensured so that usage of the display panel will not be limited by ambient environment and the display panel will be widely applied. Specifically, the liquid absorbing layer may be formed by performing a spin coating process and then a photolithographic process, or by a spray coating process through a mask, or by an evaporation process through a mask.

Further, when the step S702 of the method according to the embodiments of the present invention is performed to irradiate the liquid crystal case, the irradiation may specifically be achieved in the following manner. The liquid crystal case is irradiated with ultraviolet ray through the liquid absorbing layer serving as a mask, without needing a special mask, so that the liquid crystal case is selectively irradiated. Thereby, the liquid crystal molecules are photopolymerized such that the more the distance between the each of the plurality of pixel electrodes and the light source of the edge-lighting type light source module is, the more the area occupied by the polymer network formed by photopolymerizing the liquid crystal molecules by irradiating them with ultraviolet ray in the region corresponding to the each of the plurality of pixel electrodes is.

Base on the same inventive concept, embodiments of the present invention also provide a display apparatus comprising the display panel according to the embodiments of the present invention. The display apparatus may comprise any products or parts having a displaying function, such as a mobile phone, a tablet computer, a TV, a display, a notebook computer, a digital frame, and a navigator. The embodiments of the display panel may be referred to for implementations of the display apparatus and repeated contents are no longer described for the sake of brevity.

The embodiments of the present invention provide a display panel, a method of manufacturing the display panel, and a display apparatus. In the display panel, the liquid crystal molecules of the liquid crystal layer in the region corresponding to each of the plurality pixel electrodes are in the polymer network state, and the more the distance between the each of the plurality of pixel electrodes and the light source of the edge-lighting type light source module is, the more the area occupied by the polymer network formed by photopolymerizing the liquid crystal molecules in the region corresponding to the each of the plurality of pixel electrodes is. In this way, when a voltage is applied to any one of the plurality of pixel electrodes, the liquid crystal molecules in the region corresponding to the one of the plurality pixel electrodes are affected by the polymer network when being deflected, so that their orientations are disordered, thereby scattering out light. The more the distance between the one of the plurality of pixel electrodes and the light source is, the more a light emitting area, where light is scattered out, of the region corresponding to the one of the plurality of pixel electrodes and a quantity of light emitted from the region corresponding to the one of the plurality of pixel electrodes are, thereby compensating the problem that the more the distance between the one of the plurality of pixel electrodes and the light source is, the less a quantity of light introduced from the light source into the region corresponding to the one of the plurality of pixel electrodes is, occurring in the edge-lighting type light source module. In this way, a quantity of light emitted from each pixel is controlled by adjusting its effective light emitting area, so that uniformity of a display luminance of the display panel can be effectively improved.

The embodiments of the present invention provide a display panel, a method of manufacturing the display panel, and a display apparatus, which improves the uniformity of the display luminance of the polymer-stabilized liquid crystal display.

The above embodiments are only used to explain the present invention, and should not be construed to limit the present invention. It will be appreciated by those skilled in the art that various changes and modifications may be made therein without departing from the spirit of the present invention, the scope of which is defined in the appended claims and their equivalents.

What is claimed is:

1. A display panel, comprising:
a first substrate and a second substrate opposite to each other;
a liquid crystal layer between the first substrate and the second substrate; and
a plurality of pixel electrodes on a side of the first substrate facing towards the liquid crystal layer;
wherein liquid crystal molecules of the liquid crystal layer in a region corresponding to each of the plurality pixel electrodes are in a polymer network state, and the more a distance between the each of the plurality of pixel electrodes and a light source of an edge-lighting type light source module of the display panel is, the more an area occupied by a polymer network in the region is.

2. The display panel of claim 1, wherein:
a ratio of a minimum value to a maximum value of the area occupied by the polymer network is less than 1 and is greater than or equal to $1/5$.

3. The display panel of claim 1, further comprising:
a transparent liquid absorbing layer which is located in the other area of a region where the liquid crystal layer is located than the areas where the polymer networks are located.

4. The display panel of claim 3, wherein:
the transparent liquid absorbing layer comprises: a first light absorbing layer on the other side of the first substrate facing away from the liquid crystal layer; and a second light absorbing layer on a side of the second substrate facing away from the liquid crystal layer.

5. The display panel of claim 3, further comprising:
a first orientation layer on a side of the pixel electrodes facing towards the liquid crystal layer; and
a second orientation layer on the other side of the second substrate facing towards the liquid crystal layer;
wherein the transparent liquid absorbing layer comprises: a third light absorbing layer between the first orientation layer and the first substrate; and a fourth light absorbing layer between the second orientation layer and the second substrate.

6. The display panel of claim 5, further comprising:
a common electrode between the second substrate and the second orientation layer;
wherein the third light absorbing layer is located between the first orientation layer and a film layer where the pixel electrodes are located, or is located between the film layer where the pixel electrodes are located and the first substrate; and
wherein the fourth light absorbing layer is located between the second orientation layer and the common electrode, or is located between the common electrode and the second substrate.

7. The display panel of claim 3, wherein:
a material of the transparent liquid absorbing layer comprises a polymethyl methacrylate material in which a first light absorbing material is mixed; or a polyimide material in which a second light absorbing material is mixed.

8. The display panel of claim 7, wherein:
the first and second light absorbing materials comprise any one of the group of salicylate, benzophenone, benzotriazole, substituted acrylonitrile, triazine, and hindered amine.

9. The display panel of claim 1, wherein:
the liquid crystal molecules of the liquid crystal layer comprise photopolymerisable liquid crystal molecules.

10. The display panel of claim 9, wherein:
the photopolymerisable liquid crystal molecules are liquid crystal molecules containing vinyl.

11. The display panel of claim 9, further comprising:
a polymerization initiator in the liquid crystal layer.

12. A display apparatus, comprising:
the display panel according to claim 1.

13. A method of manufacturing a display panel, the method comprising:
forming a liquid crystal case, wherein the liquid crystal case comprises: a first substrate and a second substrate opposite to each other; a liquid crystal layer between the first substrate and the second substrate; and a plurality of pixel electrodes on a side of the first substrate facing towards the liquid crystal layer; and
irradiating the liquid crystal case to photopolymerize liquid crystal molecules of the liquid crystal layer in a region corresponding to each of the plurality pixel electrodes, thereby forming a polymer network, such that the more a distance between the each of the plurality of pixel electrodes and a light source of an edge-lighting type light source module of the display panel is, the more an area occupied by the polymer network formed by photopolymerizing the liquid crystal molecules in the region is.

14. The method of claim 13, wherein the step of irradiating the liquid crystal case comprises:
irradiating the liquid crystal case with ultraviolet ray through a mask, wherein the mask comprises a plurality of opening regions in one-to-one correspondence with the plurality of pixel electrodes, and the more the distance between the each of the plurality of pixel electrodes and the light source of the edge-lighting type light source module of the display panel is, the more an area occupied by the opening region corresponding to the each of the plurality of pixel electrodes is.

15. The method of claim 13, further comprising:
forming, while the liquid crystal case is being formed, a transparent liquid absorbing layer in the other area of a region where the liquid crystal layer is located than the areas where the polymer networks to be formed are located; and
wherein the irradiating the liquid crystal case comprises irradiating the liquid crystal case with ultraviolet ray.

16. The method of claim 15, wherein the step of irradiating the liquid crystal case with the ultraviolet ray comprises:
irradiating the liquid crystal case with the ultraviolet ray with the light absorbing layer as a mask.

17. The method of claim 15, wherein:
a material of the light absorbing layer comprises a polymethyl methacrylate material in which a first light absorbing material is mixed; or a polyimide material in which a second light absorbing material is mixed.

18. The method of claim 17, wherein:
the first and second light absorbing materials comprise any one of the group of salicylate, benzophenone, benzotriazole, substituted acrylonitrile, triazine, and hindered amine.

19. The method of claim 13, wherein:
the liquid crystal molecules in the liquid crystal layer comprise liquid crystal molecules containing vinyl.

20. The method of claim 13, wherein:
the display panel further comprises a polymerization initiator in the liquid crystal layer.

* * * * *